(12) United States Patent
Nguyen et al.

(10) Patent No.: US 11,537,772 B1
(45) Date of Patent: Dec. 27, 2022

(54) SYNCHRONIZED CLOCK SIGNALS FOR CIRCUIT EMULATORS

(71) Applicant: Cadence Design Systems, Inc., San Jose, CA (US)

(72) Inventors: Quang Nguyen, San Jose, CA (US); Ty Doan, San Jose, CA (US); Pinchas Herman, San Jose, CA (US); Gidon Maas, San Jose, CA (US)

(73) Assignee: Cadence Design Systems, Inc.

( * ) Notice: Subject to any disclaimer, the term of this patent is extended or adjusted under 35 U.S.C. 154(b) by 1035 days.

(21) Appl. No.: 16/233,857

(22) Filed: Dec. 27, 2018

(51) Int. Cl.
 *G06F 1/12* (2006.01)
 *G06F 30/331* (2020.01)
 *H03K 19/17736* (2020.01)
 *G06F 1/08* (2006.01)

(52) U.S. Cl.
 CPC .............. *G06F 30/331* (2020.01); *G06F 1/08* (2013.01); *G06F 1/12* (2013.01); *H03K 19/1774* (2013.01)

(58) Field of Classification Search
 CPC combination set(s) only.
 See application file for complete search history.

(56) References Cited

U.S. PATENT DOCUMENTS

| | | | |
|---|---|---|---|
| 9,294,094 B1 | 3/2016 | Ramabadran | |
| 9,405,877 B1 | 8/2016 | Ramabadran | |
| 9,495,492 B1 | 11/2016 | Ramabadran | |
| 2008/0259963 A1* | 10/2008 | Tanis | H04Q 11/04 370/498 |
| 2014/0149780 A1* | 5/2014 | Dally | G06F 1/12 713/503 |
| 2016/0224638 A1* | 8/2016 | Bestler | G06F 11/1076 |
| 2018/0083686 A1* | 3/2018 | Maehata | H04L 25/49 |
| 2019/0028185 A1* | 1/2019 | Tomasicchio | H04B 7/0486 |
| 2021/0157388 A1* | 5/2021 | Kulandaivel | G06F 1/08 |

* cited by examiner

*Primary Examiner* — Zahid Choudhury
(74) *Attorney, Agent, or Firm* — Vista IP Law Group, LLP (57) ABSTRACT

A system includes a first cross-point switch receiving a first plurality of clock inputs and outputting a first plurality of clock outputs, a first plurality of buffering devices receiving the first plurality of clock outputs and outputting a first plurality of buffered clock signals synchronized with each other, a first plurality of connectors receiving the first plurality of buffered clock signals and outputting a plurality of blade signals to a plurality of blades. Each blade includes a plurality of programmable logic devices, an operation of which is synchronized based on the first plurality of clock inputs. Each blade includes a second cross-point switch to receive a blade signal of the plurality of blade signals. The second cross-point switch outputs a second plurality of clock outputs based on the received blade signal, and the second plurality of clock outputs are provided to the programmable logic devices.

20 Claims, 7 Drawing Sheets

SYNCHRONIZED CLOCK SIGNALS FOR CIRCUIT EMULATORS

TECHNICAL FIELD

Embodiments described herein are generally related to the field of circuit emulation in circuit modeling and fabrication. More specifically, embodiments described herein are related to systems to provide synchronized clock signals in a circuit emulator (e.g., a prototyping system) including a large number of field-programmable gate arrays (FPGAs) configured to emulate multiple netlists in one or more integrated circuit designs.

BACKGROUND

Designers of integrated circuit devices ("chips"), generally application-specific integrated circuits ("ASICs"), use prototyping as part of the electronic design automation process prior to manufacture of the chip. Prototyping is one type of hardware-based functional verification that allows the circuit designer to observe the behavior of the circuit design under conditions approximating its final, manufactured performance. During prototyping, a circuit design, generally written in register transfer language ("RTL") code, is programmed into one or more programmable logic chips, frequently field-programmable gate arrays ("FPGA") on a prototyping board. FPGA-based prototypes are a fully functional representation of the circuit design, its circuit board, and its input/output ("I/O") devices. Also, FPGA prototypes generally run at speeds much closer to the clock speed at which the manufactured chip will run than other types of functional verification, e.g., software simulation, thereby allowing for verifying the circuit design under many more conditions in the same amount of time than other verification methods, and in particular, software simulation. The circuit design prototype may also be operated in another electronic circuit, e.g., the electronic circuit for which the design under verification will be used after fabrication, so that the circuit design prototype may be observed and tested in an environment in which the manufactured chip will be used. As such, circuit designers may use FPGA prototyping as a vehicle for software co-development and validation, increasing the speed and accuracy of system developments.

Prototyping of a circuit design using programmable logic chips (e.g., FPGAs) can have advantages over other types of functional verification, namely emulation using a plurality of emulation processors. First, prototyping using programmable logic chips generally results in higher speed relative to emulation using emulation processors. Second, such higher-speed circuit design prototypes using programmable logic chips can sometimes even run in real-time, that is, the prototype may run at the intended clock speed of the manufactured chip, rather than a reduced clock speed. This is not always the case, notably for higher performance circuit designs that have clock speeds higher than the maximum allowed by the programmable logic chips. Third, such prototyping systems using programmable logic chips are generally of lower cost than an emulation system using processors.

An FPGA often has less logical capacity than required to implement the circuit design, and thus the number of logic gates available in the FPGA are insufficient to program in all the logic of the circuit design. Thus, the current state of FPGA technology does not allow the entirety of the logic of a single ASIC to be prototyped within a single FPGA. This may be overcome by mapping/partitioning the logic of the large circuit design to several FPGAs on a prototyping system. With the increase in the number of FPGAs being employed, the number of clocks operating the FPGAs also increase. This requires new methods of distributing and synchronizing clocks to these FPGAs.

The description provided in the background section should not be assumed to be prior art merely because it is mentioned in or associated with the background section. The background section may include information that describes one or more aspects of the subject technology.

SUMMARY

In a first embodiment, a system is described, the system having a first device having a first non-blocking cross-point switch receiving a first plurality of clock inputs and outputting a first plurality of clock outputs, a first plurality of buffering devices corresponding to the first plurality of clock outputs, the first plurality of buffering devices configured to synchronize the first plurality of clock outputs with each other, and output a first plurality of buffered clock signals, and a plurality of programmable logic devices each receiving a corresponding buffered clock signal of the first plurality of buffered clock signals and an operation of the plurality of programmable logic devices is synchronized based on the received first plurality of buffered clock signals.

In a second embodiment, a system is described, the system including a first non-blocking cross-point switch receiving a first plurality of clock inputs and outputting a first plurality of clock outputs, a first plurality of buffering devices receiving the first plurality of clock outputs and outputting a first plurality of buffered clock signals, the first plurality of buffered clock signals being synchronized with each other, a first plurality of connectors receiving the first plurality of buffered clock signals and outputting a plurality of blade signals, a plurality of blades receiving the plurality of blade signals, each blade including a plurality of programmable logic devices, an operation of each programmable logic device being synchronized based on the first plurality of clock inputs.

In yet another embodiment, a system is described, the system including a first non-blocking cross-point switch receiving a first plurality of clock inputs and outputting a first plurality of clock outputs, the first plurality of clock outputs including a first set of clock outputs and a second set of clock outputs, a first set of buffering devices receiving the first set of clock outputs and outputting a first set of buffered clock signals, a second set of buffering devices receiving the second set of clock outputs and outputting a second set of buffered clock signals, the first set of buffered clock signals and the second set of buffered clock signals being synchronized with each other, and a second non-blocking cross-point switch receiving a second plurality of clock inputs and outputting a second plurality of clock outputs. The second plurality of clock outputs are provided to the first set of buffering devices. The first set of buffering devices outputting a first set of buffered clock signals based on one of the first set of clock outputs and the second plurality of clock outputs. The second set of buffering devices outputting a second set of buffered clock signals based on the second set of clock outputs. The system further includes a first set of connectors receiving the first set of buffered clock signals and outputting a first plurality of blade signals based on the first set of buffered clock signals, a second set of connectors receiving the second set of buffered clock signals and outputting a second plurality of blade signals based on the second set of buffered clock signals, and a plurality of blades receiving the first plurality of blade signals and the second plurality of blade signals. Each blade includes a plurality of programmable logic devices, and an operation of each programmable logic device is synchronized based on one of the first plurality of clock inputs and the second plurality of clock inputs.

In a further embodiment, a system is described that includes a means for receiving a first plurality of clock inputs and outputting a first plurality of clock outputs, a means for receiving the first plurality of clock outputs and outputting a first plurality of buffered clock signals, the first plurality of buffered clock signals being synchronized with each other, a means for receiving the first plurality of buffered clock signals and outputting a plurality of blade signals, and a means for receiving the plurality of blade signals and including a plurality of programmable logic devices, an operation of each programmable logic device being synchronized based on the first plurality of clock inputs.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

Embodiments as disclosed herein address the problem of providing synchronized clock signals in a circuit architecture that includes one or more prototyping systems each including multiple programmable logic device, e.g., Field Programmable Gate Arrays (FPGAs). The multiple FPGAs operate in parallel and implement a large circuit design since a single FPGA may not include the number of logic gates sufficient to program all the logic of the circuit design.

By providing synchronized clock signals, all FPGAs operate at the same frequency and phase and clocks skews/delays between different FPGAs are minimized. Embodiments are also directed to a circuit architecture that includes one or more FPGAs that are provided a first clock that operates at a first frequency and one or more other FPGAs that are provided a second clock that operates at a second frequency different from the first frequency. Thus, the prototyping system can simultaneously support FPGAs operating at different frequencies and supporting multiple independent circuits designs.

Figure 1:
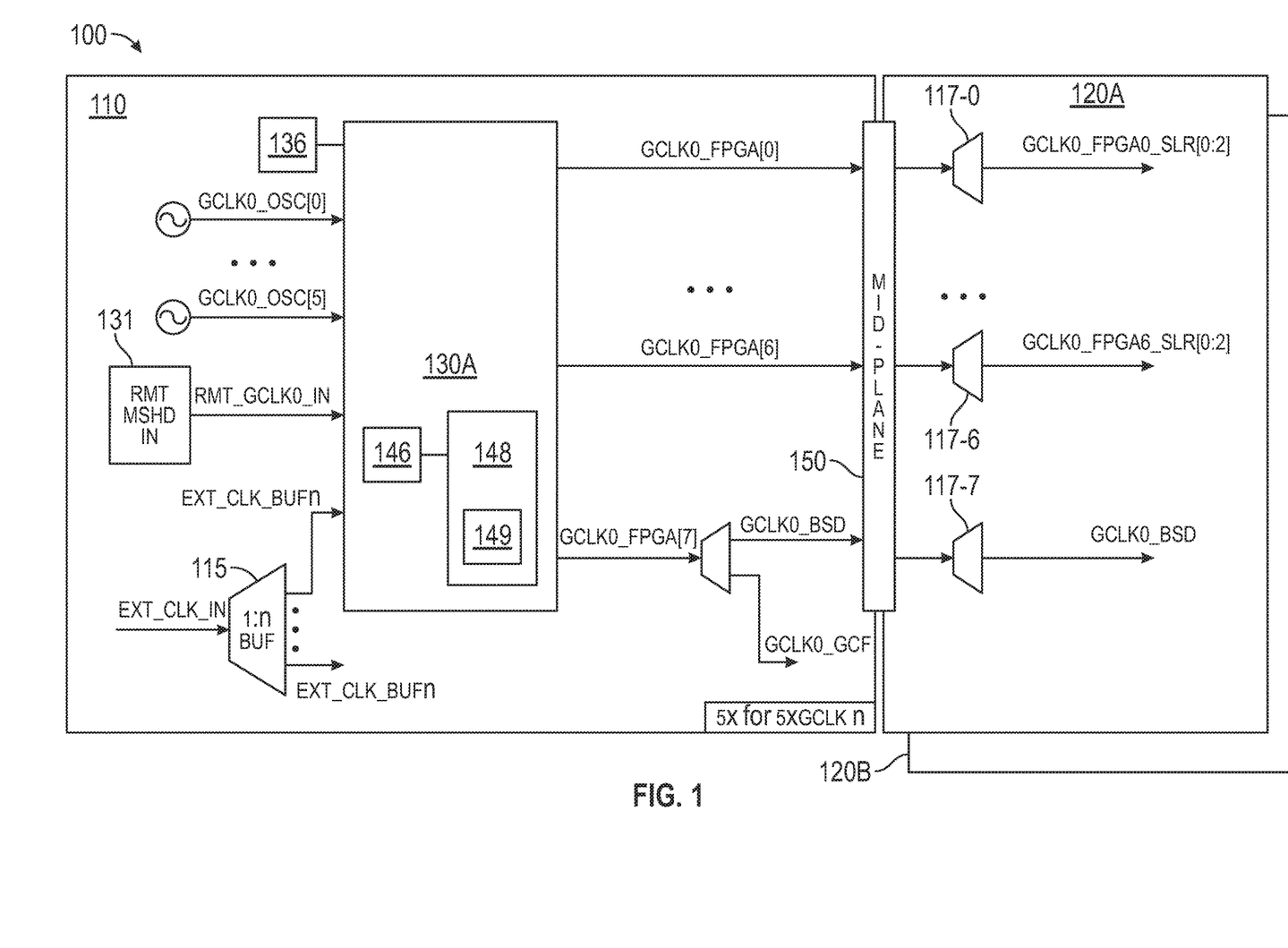
FIG. 1 illustrates a Field Programmable Gate Array (FPGA) blade including a global gateway interface board (GIB) and a two prototype processing boards (PPBs) connected to the global GIB by a mid-plane board, according to example embodiments.

FIG. 1 illustrates a FPGA blade 100 including a global gateway interface board (GIB) 110 and a two prototype processing boards (PPBs) 120A and 120B each connected to the GIB 110 by a mid-plane board 150, according to example embodiments. The GIB 110 includes a total of five groups of global clock signals GCLK[0:4], individually referred to as GCLK0, GCLK1, GCLK2, GCLK3, and GCLK4. Each global clock signal is used to generate clock signals that are provided to each FPGAs on the PPBs 120A and 120B. The GIB 110 further includes five global cross-point switches 130A-130E, each corresponding to a respective global clock GCLK0, GCLK1, GCLK2, GCLK3, and GCLK4. Each of the global cross-point switches 130A-130E include 8×8 non-blocking cross-point switches. As used herein, a non-blocking cross-point switch may refer to a switch in which an output of the switch is configured to select any input of the switch independent of the other outputs. For the sake of explanation, the first group of global clock signals GCLK0 and the clock signals included therein (or associated therewith), and the corresponding global cross-point switch 130A are discussed with reference to FIG. 1. It will be understood that the explanation is equally applicable to the remaining global clock signals GCLK1, GCLK2, GCLK3, and GCLK4.

As illustrated in FIG. 1, the first global cross-point switch 130A is provided the first group of global clock signals GCLK0. The first group of global clock signals GCLK0 includes six individual local clock inputs (also referred to a local synthesizers) GCLK0_OSC[0]-GCLK0_OSC[5] and a remote global clock input RMT_GCLK0_IN. Each local clock input in a global clock group may be assigned a different frequency or a same frequency, as desired for an application. Corresponding clock inputs in different global clock groups may also be are assigned the same frequency or different frequencies. For instance, for the first group of global clock signals GCLK0, each local clock input GCLK0_OSC[0:5] may be assigned a different frequency or a same frequency. Local clock inputs GCLK0_OSC[0], GCLK1_OSC[0], GCLK2_OSC[0], GCLK3_OSC[0], and GCLK4_OSC[0] may be assigned a same frequency or different frequencies. Similarly, the local clock inputs GCLK0_OSC[1], GCLK1_OSC[1], GCLK2_OSC[1], GCLK3_OSC[1], and GCLK4_OSC[1] may be assigned a frequency that may be the same or different from the frequencies of local clock inputs GCLK0_OSC[0], GCLK1_OSC[0], GCLK2_OSC[0], GCLK3_OSC[0], and GCLK4_OSC[0]. Thus, up to six unique users can be supported per global clock group, and each user can access a minimum of one of the FPGAs on the PPBs 120A and 120B. For example, if a design requires two FPGA[0] and FPGA[1], these FGPAs can be assigned the same clock from GCLK0_OSC[0], and GCLK_OSC[1] is available for other FPGAs. By extension, if a design requires all seven FPGA [0:6], they are assigned to the same clock from GCLK0_OSC[0], and GCLK_OSC[1:5] are free. Similarly, the clock inputs from the remaining four clock groups GCLK[1:4] can be distributed.

The remote global clock input RMT_GCLK0_IN is obtained from a mini-Serial Attached SCSI HD (MSHD) connector 131 that receives a clock signal from another external blade when multiple blades 100 are cascaded (e.g., See, FIG. 3) to increase the number of FPGAs for implementing a large circuit design. The MSHD connector 131 provides a total of five remote global clock inputs RMT_CLK0_IN to RMT_CLK4_IN. The first global cross-point switch 130A is also provided a buffered output of an external user clock signal EXT_CLK_IN. As illustrated, the external user clock EXT_CLK_IN is buffered using a buffer 115 and five buffered outputs EXT_CLK_BUF[0:4] are obtained. The buffered output EXT_CLK_BUF0 is provided as an input to the first global cross-point switch 130A, while the other buffered outputs EXT_CLK_BUF[1:4] are provided to the other global cross-point switches 130B-130E. Thus, the external user clock signal EXT_CLK_IN is common to all groups of global clock signals.

The first global cross-point switch 130A outputs eight individual FPGA clock signals GCLK0_FPGA[0]-GCLK0_FPGA[7]. Out of these, seven FPGA clock signals GCLK0_FPGA[0]-GCLK0_FPGA[6] are provided to a corresponding one of seven FPGAs on the PPBs 120A and 120B (described below). The eighth FPGA clock signal GCLK0_FPGA[7] is provided to a buffer 113 to obtain FPGA clock signals GCLK0_BSD and GCLK0_GCF. The FPGA clock signal GCLK0_BSD is provided to a Bit Stream Director (BSD) FPGA, an FPGA that is used for checking the clock frequencies provided to the seven FPGAs on the PPBs 120A and 120B. The FPGA clock signal GCLK0_GCF is provided to a Gateway Controller FPGA (GCF), an FPGA on board the GIB 110 and used for generating reset and synchronizing signals.

As illustrated, the clock signals GCLK0_FPGA[0]-GCLK0_FPGA[6] and GCLK0_BSD are provided to the mid-plane board 150, and are passed to the PPBs 120A and 120B via the mid-plane board 150. Likewise, clock signals output by the other global cross-point switches 130B-130E are also provided to the mid-place board 150. For instance, clock signals GCLK1_FPGA[0]-GCLK1_FPGA[6] and GCLK1_BSD, GCLK2_FPGA[0]-GCLK2_FPGA[6] and GCLK2_BSD, GCLK3_FPGA[0]-GCLK3_FPGA[6] and GCLK3_BSD, GCLK4_FPGA[0]-GCLK4_FPGA[6] and GCLK4_BSD are all provided to the mid-place board 150. FIG. 1 illustrates the clock signal generation and distribution of the first group of global clock signals GCLK0. The clock signal generation and distribution of the remaining groups of global clock signals GCLK1, GCLK2, GCLK3, and GCLK4 is similar to the first group of global clock signals GCLK0, and an explanation thereof is omitted for the sake of brevity.

The global cross-point switch 130A is operably connected to a processor 136 to receive instructions for routing interconnection paths between the inputs and the outputs of the global cross-point switch 130A. The global cross-point switch 130A receives the instructions from processor 136 and may configure itself to route interconnection paths according to the instructions. The global cross-point switch 130A may enable the routing of interconnection paths between any of the inputs GCLK0_OSC[0]-GCLK0_OSC[5] to any of the outputs GCLK0_FPGA[0]-GCLK0_FPGA[7]. The processor 136 may also be connected to the other global cross-point switches 130B-130E on the GIB 110. Alternatively, each global cross-point switch 130A-130E can be connected to an individual processor.

Alternatively, or in addition, the global cross-point switch 130A may include an internal processing circuitry 146 communicably coupled to a memory 148 that includes a switch routing module 149. Memory 148 may be any suitable storage device for storing instructions to be executed by processing circuitry, including but not limited to Random Access Memory (RAM), a flash memory, a Read Only Memory (ROM), a Programmable Read-Only Memory (PROM), an Electrically Erasable PROM (EEPROM), registers, or any other suitable storage device or computer readable storage medium. Processing circuitry 146 may be a microcontroller, a Digital Signal Processor (DSP), an Application-Specific Integrated Circuit (ASIC), a FPGA, a programmable logic device (PLD), a controller, a state machine, gated logic, discrete hardware components, or any other suitable circuitry or entity for executing instructions stored in memory 148.

The switch routing module 149 may be a set of computer readable instructions, such as firmware, that processing circuitry 146 may execute to program the global cross-point switch 130A to route the interconnection between the inputs and the outputs of the global cross-point switch 130A. Alternatively, in other embodiments, the switch routing module 149 may be implemented in hardware that is included in the global cross-point switch 130A. In still other embodiments, the switch routing module 149 may be implemented as a combination of hardware and software. The other global cross-point switches 130B-130E may also similarly include internal processing circuitry and memory having a switch routing module, and an explanation thereof is omitted for the sake of brevity.

The PPB 120A includes two FPGAs and PPB 120B includes five FPGAs. Each of the seven FPGAs include three slices. Each clock signal GCLK0_FPGA[0]-GCLK0_FPGA[6] is buffered using a respective buffer 117-0 to 117-6 to obtain corresponding FPGA clock signals GCLK0_FPGA0_SLR[0:2]-GCLK0_FPGA6_SLR[0:2]. Each FPGA clock signal is provided to each slice of each of the seven FPGAs on the PPBs 120A and 120B. Thus, FPGA clock signal GCLK0_FPGA0_SLR[0] is provided to a first slice of a first FPGA, FPGA clock signal GCLK0_FPGA0_SLR[1] is provided to a second slice of a first FPGA, and FPGA clock signal GCLK0_FPGA0_SLR[2] is provided to a third slice of a first FPGA. For the sake of illustration, the FPGA clock signals GCLK0_FPGA0_SLR[0:2]-GCLK0_FPGA6_SLR[0:2] are not shown to be connected individually to the FPGAs on the PPBs 120A and 120B.

The clock signal GCLK0_BSD is buffered using buffer 117-7 to obtain a buffered version of the signal for providing to the Bit Stream Director (BSD) FPGA located on a separate circuit board that is also connected to the mid-place board 150. It should be noted that the clock signal GCLK0_BSD is buffered in order to minimize delays between the clock signal GCLK0_BSD and the buffered clock signals GCLK0_FPGA[0]-GCLK0_FPGA[6]. Since clock signals from the cross-point switch 130A to all FPGAs must be skew controlled, it should be noted that the buffer used for clock signals GCLK0_BSD and GCLK0_GCF is included in the overall delay calculation to minimize skew between the clock signals GCLK_BSD, GCLK0_GCF, and GCLK0_FPGA[0]-GCLK0_FPGA[6].

The blade 100 in FIG. 1 includes a maximum of seven FPGAs for a user to perform an emulation of multiple netlists of an integrated circuit design. When an increased number of FPGAs are required, for instance, for a circuit design that cannot be emulated using the seven FPGAs, multiple blades 100 can be cascaded to increase the number of FPGAs available.

Figure 2:
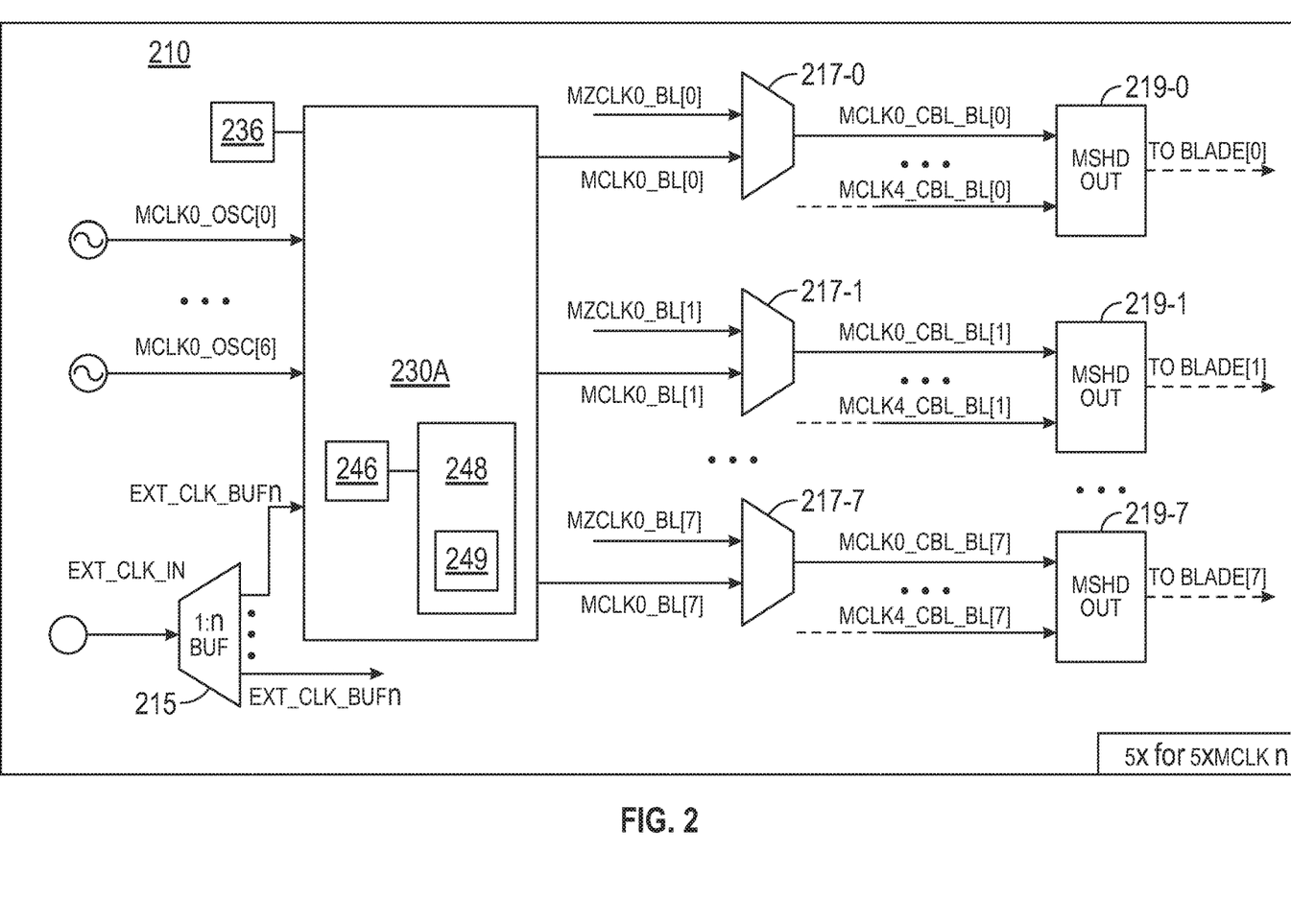
FIG. 2 illustrates a master Gateway Interface Board (GIB) that can be connected to eight blades of FIG. 1, according to example embodiments.

FIG. 2 illustrates a master Gateway Interface Board (GIB) 210 that can be connected to eight blades 100, according to some embodiments. The master GIB 210 includes a total of five groups of master clock signals MCLK[0:4], individually referred to as MCLK0, MCLK1, MCLK2, MCLK3, and MCLK4. Each set of master clock signals MCLK[0:4] includes seven individual clock inputs MCLK[0:4]_OSC[0:6] (for supporting up to seven unique users per group of master clock signals). The master GIB 210 further includes five master cross-point switches 230A-230E, each corresponding with a respective master clock MCLK0, MCLK1, MCLK2, MCLK3, and MCLK4. The master cross-point switch 230A (and master cross-point switches 230B-230E, similarly) may be operably connected to a processor to receive instructions for routing interconnection paths between the inputs and the outputs of the master cross-point switch 230A (and 230B-230E), similar to the global cross-point switches 130A-130E. For example, and as illustrated, the master cross-point switch 230A is connected to processor 236, similar to the processor 136 (FIG. 1). Each master cross-point switch 230A-230E may be commonly connected to the processor 236, or each master cross-point switch 230A-230E may be coupled to an individual processor. Additionally, or alternatively, the master cross-point switch 230A (and master cross-point switches 230B-230E, similarly) may also include an internal processing circuitry 246 communicably coupled to a memory 248 that includes a switch routing module 249. The processing circuitry 246, memory 248, and a switch routing module 249 may be similar to the internal processing circuitry 146, memory 148, and switch routing module 149 described with respect to FIG. 1, and an explanation thereof will be omitted here for the sake of conciseness. Each of the master cross-point switches 230A-230E are 8×8 cross-point switches. For the sake of explanation, the first group of master clock signals MCLK0 and the clock signals included therein (or associated therewith), and the corresponding master cross-point switch 230A are discussed with reference to FIG. 2. It will be understood that the explanation is equally applicable to the other master clock signals MCLK1, MCLK2, MCLK3, and MCLK4.

As illustrated in FIG. 2, the first master cross-point switch 230A is provided with the first group of master clock signals MCLK0. More specifically, the first group of master clock signals MCLK0 includes seven individual clock inputs (or synthesizers) MCLK0_OSC[0]-MCLK0_OSC[6] that are provided to the first master cross-point switch 230A. The first master cross-point switch 230A is also provided a buffered output of an external user clock signal EXT_CLK_IN. As illustrated, the external user clock EXT_CLK_IN is buffered using a buffer 215 and five buffered outputs EXT_CLK_BUF[0:4] are obtained. The buffered output EXT_CLK_BUF0 is provided as an input to the first master cross-point switch 230A, while the other buffered outputs are provided to the other master cross-point switches 230B-230E. Thus, the external user clock signal EXT_CLK_IN is common to all groups of master clock signals.

Figure 3:
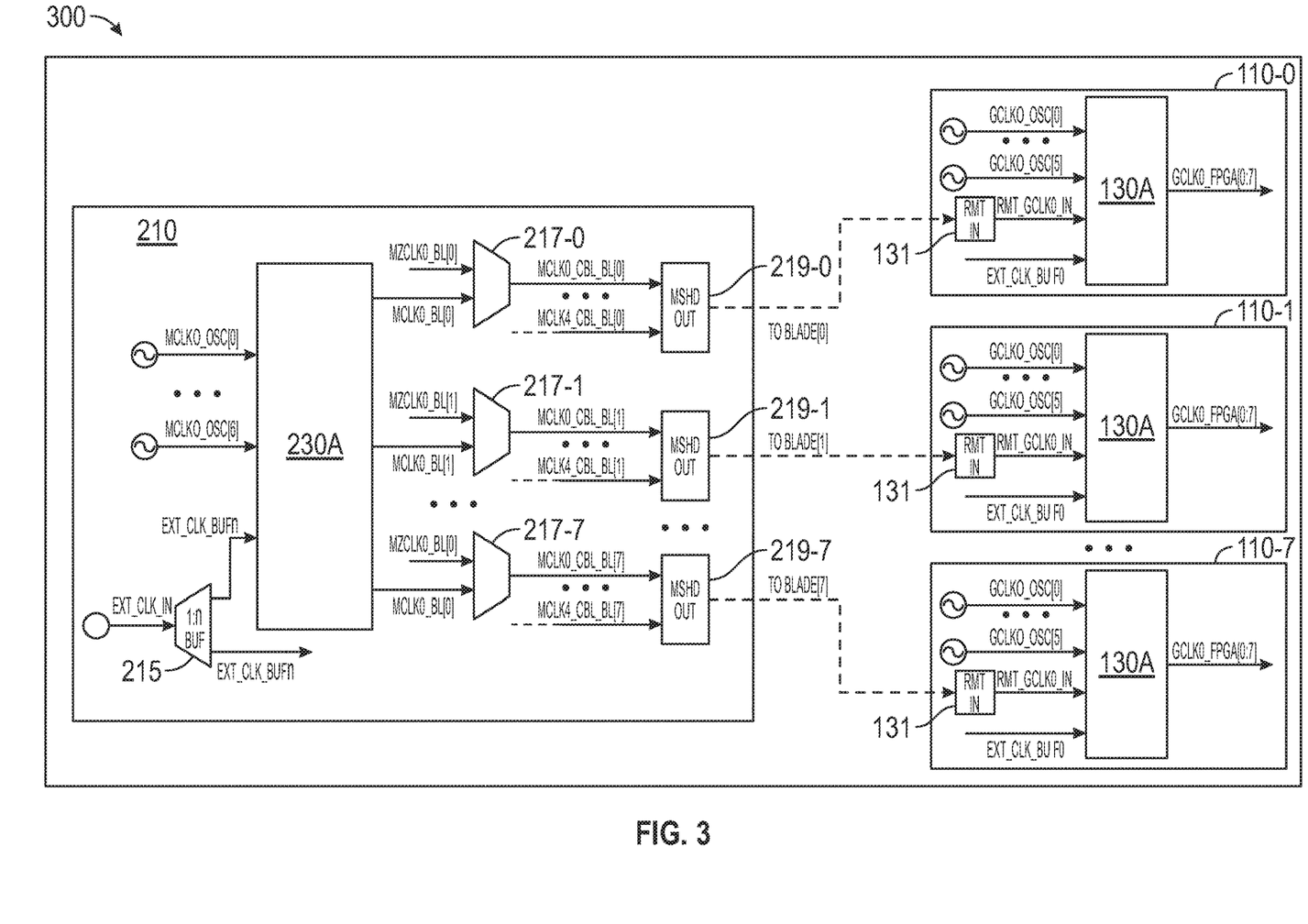
FIG. 3 illustrates a system including eight global GIBs of FIG. 1 connected to the master GIB of FIG. 3, according to example embodiments.

The first master cross-point switch 230A outputs eight individual blade clock signals MCLK0_BL[0]-MCLK0_BL[7], each provided to a blade 100 out of the eight blades connected to the master GIB 210 (See FIG. 3). The blade clock signals MCLK0_BL[0]-MCLK0_BL[7] are provided to corresponding buffers 217-0-217-7 (collectively, buffers 217). In an embodiment and as illustrated, the buffers 217 are implemented using 2:1 multiplexers. One of the input of the multiplexer is connected to a corresponding blade clock signal MCLK0_BL[0]-MCLK0_BL[7], while the other input of the multiplexer is connected to a corresponding mezzanine clock signal MZCLK0_BL[0]-MZCLK0_BL[7] (described below). A control input (or selection input) of each multiplexer is selected (e.g., based on a command provided by the processor 236) such that the input connected to the mezzanine clock signals MZCLK0_BL[0]-MZCLK0_BL[7] are ignored. The output of the buffers (multiplexers) 217 are buffered blade clock signals MCLK0_CBL_BL[0]-MCLK0_CBL_BL[7]. Each buffered blade clock signal MCLK0_CBL_BL[0]-MCLK0_CBL_BL[7] is provided to a corresponding MSHD OUT connector 219-0-219-7 (collectively, MSHD OUT connectors 219).

As mentioned above, the master GIB 210 includes five groups of master clock signals MCLK0, MCLK1, MCLK2, MCLK3, and MCLK4. The MSHD OUT connectors 219 also receive the corresponding buffered blade clock signals of the remaining groups of master clock signals MCLK1, MCLK2, MCLK3, and MCLK4. For instance, MSHD OUT connector 219-0 receives the buffered blade clock signals MCLK1_CBL_BL[0], MCLK2_CBL_BL[0], MCLK3_CBL_BL[0], and MCLK4_CBL_BL[0] from the remaining groups of master clock signals MCLK1, MCLK2, MCLK3, and MCLK4. Similarly, MSHD OUT connector 219-1 receives the buffered blade clock signals MCLK1_CBL_BL[1], MCLK2_CBL_BL[1], MCLK3_CBL_BL[1], and MCLK4_CBL_BL[1] from the remaining groups of master clock signals MCLK1, MCLK2, MCLK3, and MCLK4. Thus, it will be understood that the buffered blade clock signals from a group of master clock signals for a blade are provided to a single corresponding connector. Additionally, the five buffered blade clock signals are input to the corresponding connector via a single MSHD cable. By providing the buffered blade clock signals in this manner, delays/skews between the buffered blade clock signals are minimized. Such a configuration permits using only one clock cable to distribute all five buffered blade clock signals.

The output from the MSHD OUT connectors 219 are provided to respective blades 100 as outputs BL[0:7]. For example, the output of MSHD OUT connectors 219-0 is provided to a first blade 100-0 (out of the eight blades, See FIG. 3) connected to the master GIB 210 and indicated by the connection "TO BLADE[0]". Similarly, the output of MSHD OUT connectors 219-1 is provided to a second blade 100-1 connected to the master GIB 210 and indicated by the connection "TO BLADE[1]". FIG. 2 illustrates the clock signal generation and distribution of the first group of master clock signals MCLK0. The clock signal generation and distribution of the remaining groups of master clock signals MCLK1, MCLK2, MCLK3, and MCLK4 is similar to the first group of master clock signals MCLK0, and an explanation thereof is omitted for the sake of brevity.

FIG. 3 illustrates a system 300 including eight GIBs 110 connected to the master GIB 210, according to example embodiments. Each GIB 110-0-110-7 is similar in some aspects to the GIB 110 in FIG. 1 and is best understood with reference thereto. As illustrated, the outputs from the MSHD OUT connectors 219[0:7] are provided to a corresponding one of GIBs 110-0-110-7. For example, the output from MSHD OUT connectors 219-0 is provided to the connector 131 on the GIB 110-0 as indicated by the connection "TO BLADE[0]". Similarly, the output from MSHD OUT connectors 219-1 is provided to the connector 131 on the GIB 110-1 as indicated by the connection "TO BLADE[1]". Each GIB is connected to seven FPGAs. Thus, by connecting (cascading) one master GIB 210 to eight GIBs 110-0-110-7, all eight GIBs 110[0:7] are driven by the same master clock signal MCLK of the master GIB 210. In this configuration, the total number of FPGAs are increased to 56. Because the FPGAs are now synchronized to the master clock signals MCLK0, MCLK1, MCLK2, MCLK3, and MCLK4, the local clock inputs, e.g., GCLK[0:4]_OSC[0:5] on the GIBs 110[0:7] are ignored. It should be noted that the MSHD cables connecting the master GIB 210 to the GIBs 110[0:7] have the same length in order to minimize the delays/skew between the clock signals transmitted to the GIBs 110[0:7]. For instance, cables connecting the MSHD OUT connectors 219[0:7] to the connector 131 on the corresponding GIB 110[0:7], have the same length to minimize delays/skew.

In each group of master clock signals, the GIBs 110[0:7], and thereby the blades connected thereto, can be grouped together to form a set including at least two GIBs 110. The smallest set includes two GIBs 110, and require the largest number of clock inputs MCLK0_OSC[0:6]. Referring to FIG. 3, for the group of master clock signals MCLK0, a set of GIBs 110 is formed by grouping the GIBs 110 based on the clock inputs MCLK0_OSC[0]-MCLK0_OSC[6]. For instance, a set including the GIBs 110-0-110-1 may be provided the clock input MCLK0_OSC[0]. Similarly, a set including the GIBs 110-2-110-3 may be provided the clock input MCLK0_OSC[1]. Thus, a maximum of four clock inputs from the clock inputs MCLK0_OSC[0]-MCLK0_OSC[6] are required for grouping the GIBs to form four sets each including two GIBs 110. The system 300 can be expanded even further to increase the number of FPGAs for implementing larger circuit designs.

Figure 4:
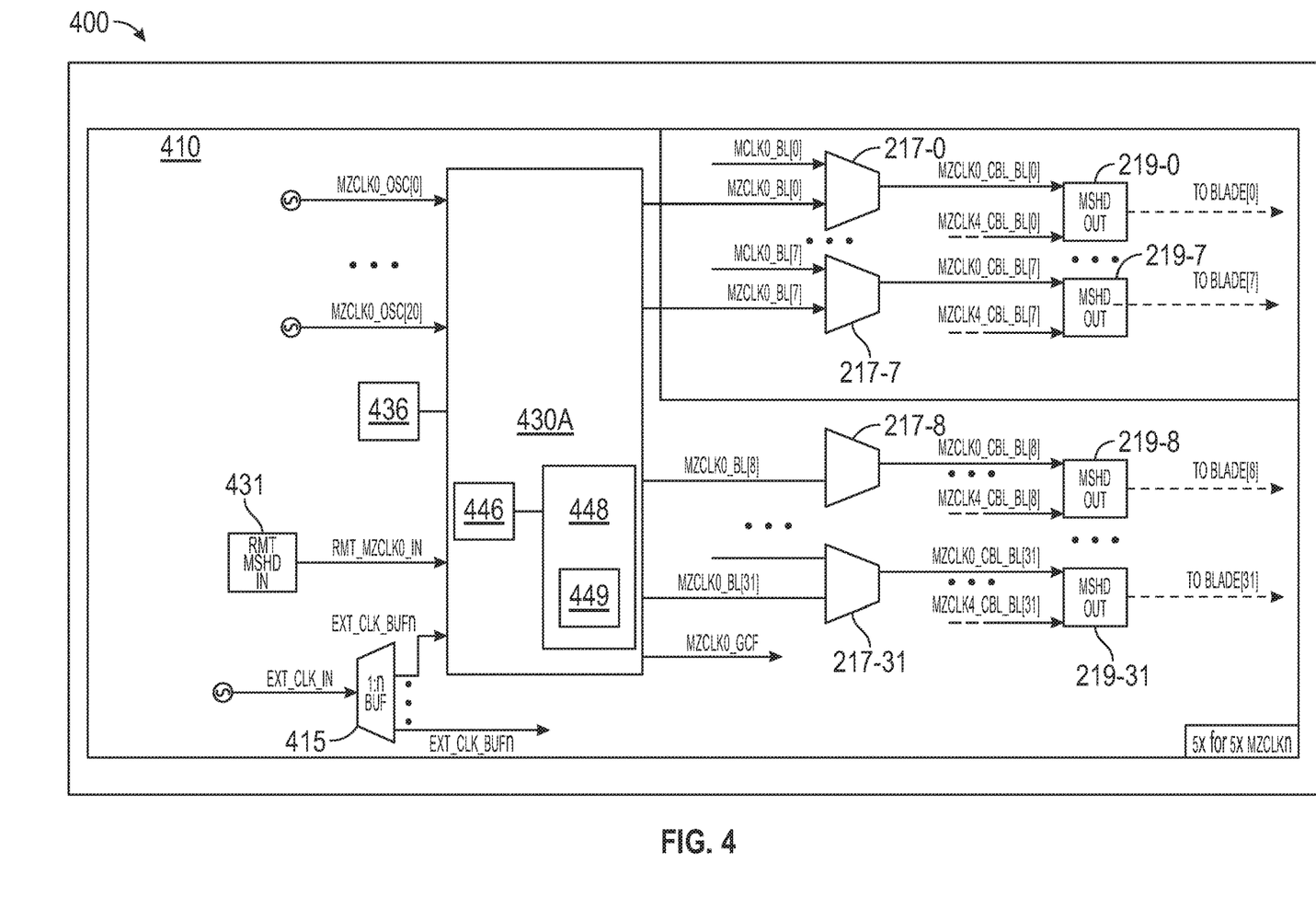
FIG. 4 illustrates a system including a mezzanine Gateway Interface Board (GIB) that can be connected to thirty two blades of FIG. 1, according to example embodiments.

FIG. 4 illustrates a system 400 including a mezzanine Gateway Interface Board (GIB) 410 that can be connected to thirty two blades 100, according to example embodiments. The mezzanine GIB 410 includes a total of five groups of mezzanine clock signals MZCLK[0:4], individually referred to as MZCLK0, MZCLK1, MZCLK2, MZCLK3, and MZCLK4. Each group of mezzanine clock signals MZCLK[0:4] includes twenty one individual clock inputs MZCLK[0:4]_OSC[0:20]. The mezzanine GIB 410 further includes five mezzanine cross-point switches 430A-430E, each corresponding to a master clock MZCLK0, MZCLK1, MZCLK2, MZCLK3, and MZCLK4. The mezzanine cross-point switch 430A (and mezzanine cross-point switches 430B-430E, similarly) may be operably connected to a processor to receive instructions for routing interconnection paths between the inputs and the outputs of the mezzanine cross-point switch 430A (and 430B-430E), similar to the global cross-point switches 130A-130E. For example, and as illustrated, the mezzanine cross-point switch 430A is connected to processor 436, similar to the processor 136 (FIG. 1). Each mezzanine cross-point switch 430A-430E may be commonly connected to the processor 436, or each mezzanine cross-point switch 430A-430E may be coupled to an individual processor. Additionally, or alternatively, the mezzanine cross-point switch 430A (and mezzanine cross-point switches 430B-430E, similarly) may also include an internal processing circuitry 446 communicably coupled to a memory 448 that includes a switch routing module 449. The processing circuitry 446, memory 448, and a switch routing module 449 may be similar to the internal processing circuitry 146, memory 148, and switch routing module 149 described with respect to FIG. 1, and an explanation thereof will be omitted here for the sake of conciseness. Each mezzanine cross-point switch 430A-430E includes a 40×40 non-blocking cross-point switch. For the sake of explanation, the first group of mezzanine clock signals MZCLK0 and the clock signals included therein (or associated therewith), and the corresponding mezzanine cross-point switch 230A are discussed with reference to FIG. 4. It will be understood that the explanation is equally applicable to the other mezzanine clock signals MZCLK1, MZCLK2, MZCLK3, and MZCLK4.

As illustrated in FIG. 4, the first mezzanine cross-point switch 430A is provided with the first group of mezzanine clock signals MZCLK0. More specifically, the first group of mezzanine clock signals MZCLK0 includes twenty one individual clock inputs (or synthesizers) MZCLK0_OSC[0]-MZCLK0_OSC[20] that are provided to the first mezzanine cross-point switch 430A. The clock inputs MZCLK0_OSC[0]-MZCLK0_OSC[20] are obtained (or generated by) twenty one different programmable clock synthesizers on the mezzanine GIB 410. Each group of mezzanine clock signals is provided the respective clock inputs from different programmable clock synthesizers on the mezzanine GIB 410. Thus, in all, the mezzanine GIB 410 includes a total of 105 programmable clock synthesizers.

The system 400 can support up to twenty one individual users per group of mezzanine clock signals, and thus a total of 105 users across the five groups of mezzanine clock groups. The first mezzanine cross-point switch 430A is also provided a remote mezzanine clock input RMT_MZCLK0_IN. The remote mezzanine clock input RMT_MZCLK0_IN is obtained from a remote mini-Serial Attached SCSI HD MSHD connector 431 that receives a clock signal from an external circuit when multiple blades 100 are cascaded (See, FIG. 6) to increase the number of FPGAs for implementing a large circuit design. The first mezzanine cross-point switch 430A is also provided a buffered output of an external user clock signal EXT_CLK_IN. As illustrated, the external user clock EXT_CLK_IN is buffered using a buffer 415 and five buffered outputs EXT_CLK_BUF[0:4] are obtained. The buffered output EXT_CLK_BUF0 is provided as an input to the first mezzanine cross-point switch 430A, while the other buffered outputs EXT_CLK_BUF[1:4] are provided to the other mezzanine cross-point switches 430B-430E. Thus, the external user clock signal EXT_CLK_IN is common to all groups of mezzanine clock signals.

The first mezzanine cross-point switch 430A outputs thirty two mezzanine blade clock signals MZCLK0_BL[0]-MZCLK0_BL[31]. Of these, the first eight mezzanine blade clock signals MZCLK0_BL[0]-MZCLK0_BL[7] are provided to corresponding buffers 217-0-217-7 (See, master GIB 210 in FIG. 2). Specifically, the blade clock signals MZCLK0_BL[0]-MZCLK0_BL[7] are provided to buffers corresponding buffers 217-0-217-7. The buffers 217-0-217-7 output buffered blade clock signals MZCLK0_CBL_BL[0]-MZCLK0_CBL_BL[7]. In an example, the buffers 217-0-217-7 are implemented using 2:1 multiplexers and each blade clock signal MZCLK0_BL[0]-MZCLK0_BL[7] is provided to a first input of a corresponding multiplexer. The control input of each multiplexers is selected such that the second inputs of the multiplexers are ignored. Thus, only the blade clock signals MZCLK0_BL

[0]-MZCLK0_BL[7] are output as the buffered blade clock signals MZCLK0_CBL_BL[0]-MZCLK0_CBL_BL[7]. The buffered blade clock signals MZCLK0_CBL_BL[0]-MZCLK0_CBL_BL[7] are provided to a corresponding MSHD OUT connectors 219-0-219-7.

The mezzanine GIB 410 includes five groups of mezzanine clock signals MZCLK[0:4], individually MZCLK0, MZCLK1, MZCLK2, MZCLK3, and MZCLK4. The MSHD OUT connectors 219-0-219-7 are also provided the corresponding buffered blade clock signals of the remaining groups of mezzanine clock signals MZCLK1, MZCLK2, MZCLK3, and MZCLK4. For instance, MSHD OUT connector 219-0 receives the buffered blade clock signals MZCLK1_CBL_BL[0], MZCLK2_CBL_BL[0], MZCLK3_CBL_BL[0], and MZCLK4_CBL_BL[0] from the remaining groups of mezzanine clock signals MZCLK1, MZCLK2, MZCLK3, and MZCLK4. Similarly, MSHD OUT connector 219-1 receives the buffered blade clock signals MZCLK1_CBL_BL[1], MZCLK2_CBL_BL[1], MZCLK3_CBL_BL[1], and MZCLK4_CBL_BL[1] from the remaining groups of mezzanine clock signals MZCLK1, MZCLK2, MZCLK3, and MZCLK4. Thus, it will be understood that the buffered blade clock signals from a group of mezzanine clock signals for a blade are provided to a single corresponding connector. Additionally, the five buffered blade clock signals are input to the corresponding connector via a single MSHD cable. By providing the buffered blade clock signals in this manner, delays/skews between the buffered blade clock signals are minimized.

The output from the MSHD OUT connectors 219-0-219-7 are provided to respective GIBs 110[0:7] as outputs BL[0:7]. For example, the output of MSHD OUT connectors 219-0 is provided to a first GIB 110-0 (out of the thirty two GIBs 110, See FIG. 5) connected to the mezzanine GIB 410 and indicated by the connection "TO BLADE[0]". Similarly, the output of MSHD OUT connectors 219-7 is provided to an eighth GIB 110-7 connected to the mezzanine GIB 410 and indicated by the connection "TO BLADE[7]". FIG. 4 illustrates the clock signal generation and distribution of the first group of mezzanine clock signals MCLK0. The clock signal generation and distribution of the remaining groups of mezzanine clock signals MZCLK1, MZCLK2, MZCLK3, and MZCLK4 is similar to the first group of mezzanine clock signals MZCLK0, and an explanation thereof is omitted for the sake of brevity.

The blade clock signals MZCLK0_BL[8]-MZCLK0_BL[31] are provided to buffers 217-8-217-31. The buffers 217-8-217-31 output buffered blade clock signals MZCLK0_CBL_BL[8]-MZCLK0_CBL_BL[31]. In an example the buffers 217-8-217-31 are implemented using 2:1 multiplexers and each blade clock signal MZCLK0_BL[8]-MZCLK0_BL[31] is provided to a first input of a corresponding multiplexer. The control input of each multiplexer is selected such that the second inputs of the multiplexers are ignored. Thus, only the blade clock signals MZCLK0_BL[8]-MZCLK0_BL[31] are output as the buffered blade clock signals MZCLK0_CBL_BL[8]-MZCLK0_CBL_BL[31]. The buffered blade clock signals MZCLK0_CBL_BL[8]-MZCLK0_CBL_BL[31] are provided to a corresponding MSHD OUT connectors 219-8-219-31.

As mentioned above, the mezzanine GIB 410 includes five groups of mezzanine clock signals MZCLK0, MZCLK1, MZCLK2, MZCLK3, and MZCLK4. The MSHD OUT connectors 219-8-219-31 also receive the corresponding buffered blade clock signals of the remaining groups of mezzanine clock signals MZCLK1, MZCLK2, MZCLK3, and MZCLK4. For instance, MSHD OUT connector 219-8 receives the buffered blade clock signals MZCLK1_CBL_BL[8], MZCLK2_CBL_BL[8], MZCLK3_CBL_BL[8], and MZCLK4_CBL_BL[8] from the remaining groups of mezzanine clock signals MZCLK1, MZCLK2, MZCLK3, and MZCLK4. Similarly, MSHD OUT connector 219-9 receives the buffered blade clock signals MZCLK1_CBL_BL[9], MZCLK2_CBL_BL[9], MZCLK3_CBL_BL[9], and MZCLK4_CBL_BL[9] from the remaining groups of master clock signals MZCLK1, MZCLK2, MZCLK3, and MZCLK4. Thus, it will be understood that the buffered blade clock signals from a group of mezzanine clock signals for a blade are provided to a single corresponding connector. Additionally, the five buffered blade clock signals are input to the corresponding connector via a single MSHD cable. By providing the buffered blade clock signals in this manner, delays/skews between the buffered blade clock signals are minimized.

The outputs from the MSHD OUT connectors 219-8-219-31 are provided to respective GIBs 110 as outputs BL[8:31]. For example, the output of MSHD OUT connectors 219-8 is provided to a ninth GIB 110-8 (out of the thirty two GIBs 110, See FIG. 5) connected to the mezzanine GIB 410 and indicated by the connection "TO BLADE[8]". Similarly, the output of MSHD OUT connectors 219-31 is provided to a thirty second GIB 110-31 connected to the mezzanine GIB 410 and indicated by the connection "TO BLADE[31]". The mezzanine cross-point switch 430A also outputs an FPGA clock signal MZCLK0_GCF is provided to a Gateway Controller FPGA (GCF), an FPGA on board the mezzanine GIB 410 and used for generating reset signals.

FIG. 4 illustrates the clock signal generation and distribution of the first group of mezzanine clock signals MCLK0. The clock signal generation and distribution of the remaining groups of mezzanine clock signals MZCLK1, MZCLK2, MZCLK3, and MZCLK4 is similar to the first group of mezzanine clock signals MZCLK0, and an explanation thereof is omitted for the sake of brevity.

Figure 5:
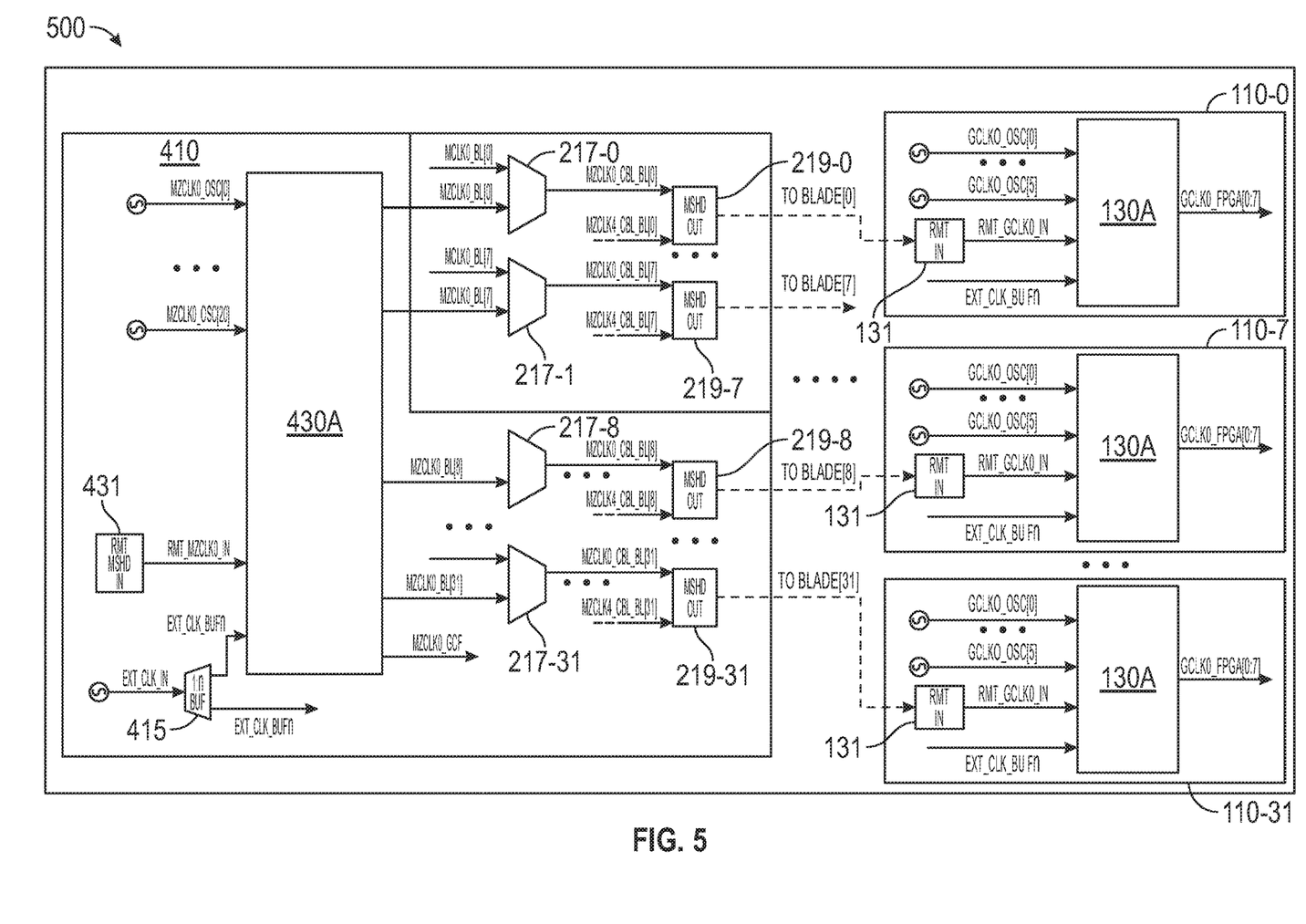
FIG. 5 illustrates a system including thirty two global GIBs of FIG. 1 connected to the mezzanine GIB of FIG. 4, according to example embodiments.

FIG. 5 illustrates a system 500 including thirty two GIBs 110-0-110-31 connected to the mezzanine GIB 410, according to example embodiments. Each GIB 110-0-110-31 is similar in some aspects to the GIB 110 in FIG. 1 and is best understood with reference thereto. As illustrated, the outputs from the MSHD OUT connectors 219-0-219-31 are provided to a corresponding one of GIBs 110-0-110-31. For example, the output from MSHD OUT connectors 219-0 is provided to GIB 110-0 as indicated by the connection "TO BLADE[0]". Each GIB is connected to seven FPGAs. Thus, by connecting (cascading) thirty two GIBs 110-0-110-31 to a single mezzanine GIB 410, the number of FPGAs are increased to 224. Because the FPGAs are now synchronized to the mezzanine clock signals MZCLK0, MZCLK1, MZCLK2, MZCLK3, and MZCLK4, the local clock inputs, e.g., GCLK[0:4]_OSC[0:5] on the GIBs 110[0:7] are ignored. It should be noted that the MSHD cables connecting the mezzanine GIB 410 to the GIBs 110 [0:31] have the same length in order to minimize the delays/skew between the clock signals transmitted to the GIBs 110 [0:31].

In each group of mezzanine clock signals, the GIBs 110[0:31], and thereby the blades connected thereto, can be grouped together to form a set including at least two GIBs 110. Referring to FIG. 5, for the group of mezzanine clock signals MZCLK0, a set of GIBs 110 is formed by grouping the GIBs 110 based on the clock inputs MZCLK0_OSC[0]-MZCLK0_OSC[20]. For instance, a set including the GIBs 110-0-110-1 may be provided the clock input MZCLK0_OSC[0]. Similarly, a set including the GIBs 110-2-110-3 may be provided the clock input MZCLK0_OSC[1]. Thus, a minimum of sixteen clock inputs from the clock inputs MZCLK0_OSC[0]-MZCLK0_OSC[20] are required for grouping the GIBs to form sets. The system 500 can be cascaded still further to increase the number of FPGAs for implementing even larger circuit designs.

Figure 6:
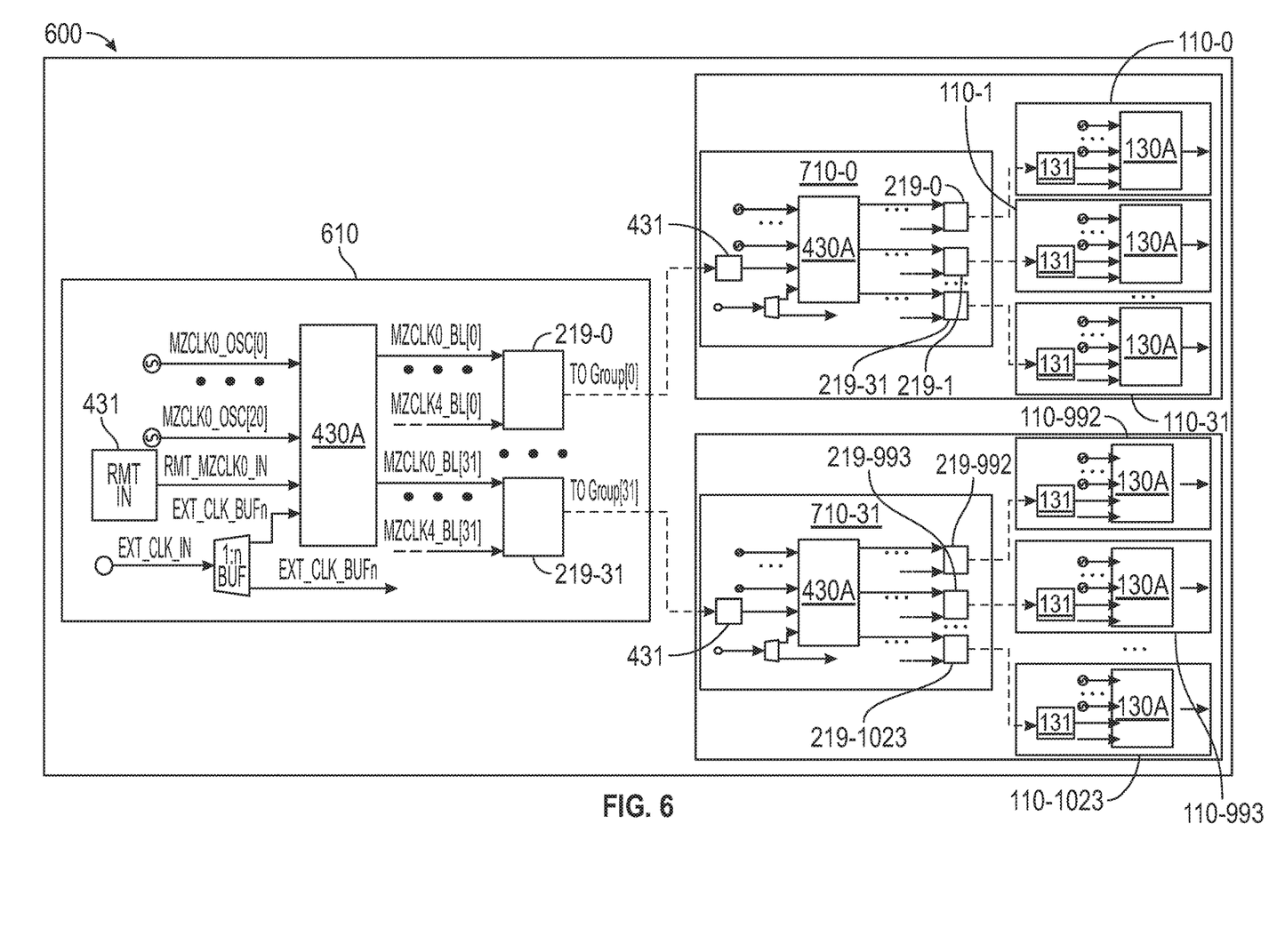
FIG. 6 illustrates a system including a mezzanine Gateway Interface Board (GIB) of FIG. 4 connected to thirty two additional mezzanine GIBs of FIG. 4, according to example embodiments.

FIG. 6 illustrates a system 600 including a Gateway Interface Board (GIB) 610 connected to thirty two additional GIBs 710-0-710-31, according to example embodiments. The GIBs 610 and 710-0-710-31 may be similar in some respects to the mezzanine GIB 410 in FIGS. 4 and 5, and therefore may be best understood with reference thereto where like numerals designate like components not described again in detail. As illustrated, the outputs from the GIB 610 are provided to the connectors 431 of the GIBs 710-0-710-31. Each of the thirty two GIBs 710-0-710-31 is connected to a GIB 110 (FIG. 1), depicted in FIG. 6 as GIBs 110[0:1023]. One GIB 710 and thirty two GIBs 110 may be considered to form a group. For example, Group[0] includes GIB 710-0 and thirty two GIBs 110[0:31]. Similarly, Group [31] includes GIB 710-31 and thirty two GIBs 110[992:1023]. The outputs from the thirty two connectors 219[0:31] on the GIB 610 are connected to the connectors 431 on the GIBs 710[0:32] in a corresponding group. For example, the output from the connector 219-0 on GIB 610 is connected to the connector 431 on the GIB 710-0 in Group[0]. Each GIB 110 is connected to seven FPGAs. Thus, the system 600 includes a total of 7168 FPGAs. Thus, the GIB 610 provides clock signals to thirty two GIBs 710[0:31] each of which in turn provides clock signals to thirty two GIBs 110[0:31]. The system 600 can be further expanded to include a total of thirty two GIBs 410 to increase the number of FPGAs to 229,376.

Embodiments disclosed herein provide many advantages over existing systems. For example, the systems 300, 400, 500, and 600 provide a flexible clock synchronization design that can be configured dynamically (e.g., via programming of one or more of the processors 136, 146, 236, 246, 436, and/or 446). For instance, a single user can be provided all FPGAs or the system can be re-configured to support multiple users on the fly without having to re-wire the clock cables. Additionally, ability of cascade the systems permits expanding the clock synchronization tree to support hundreds of thousands of FPGAs.

Figure 7:
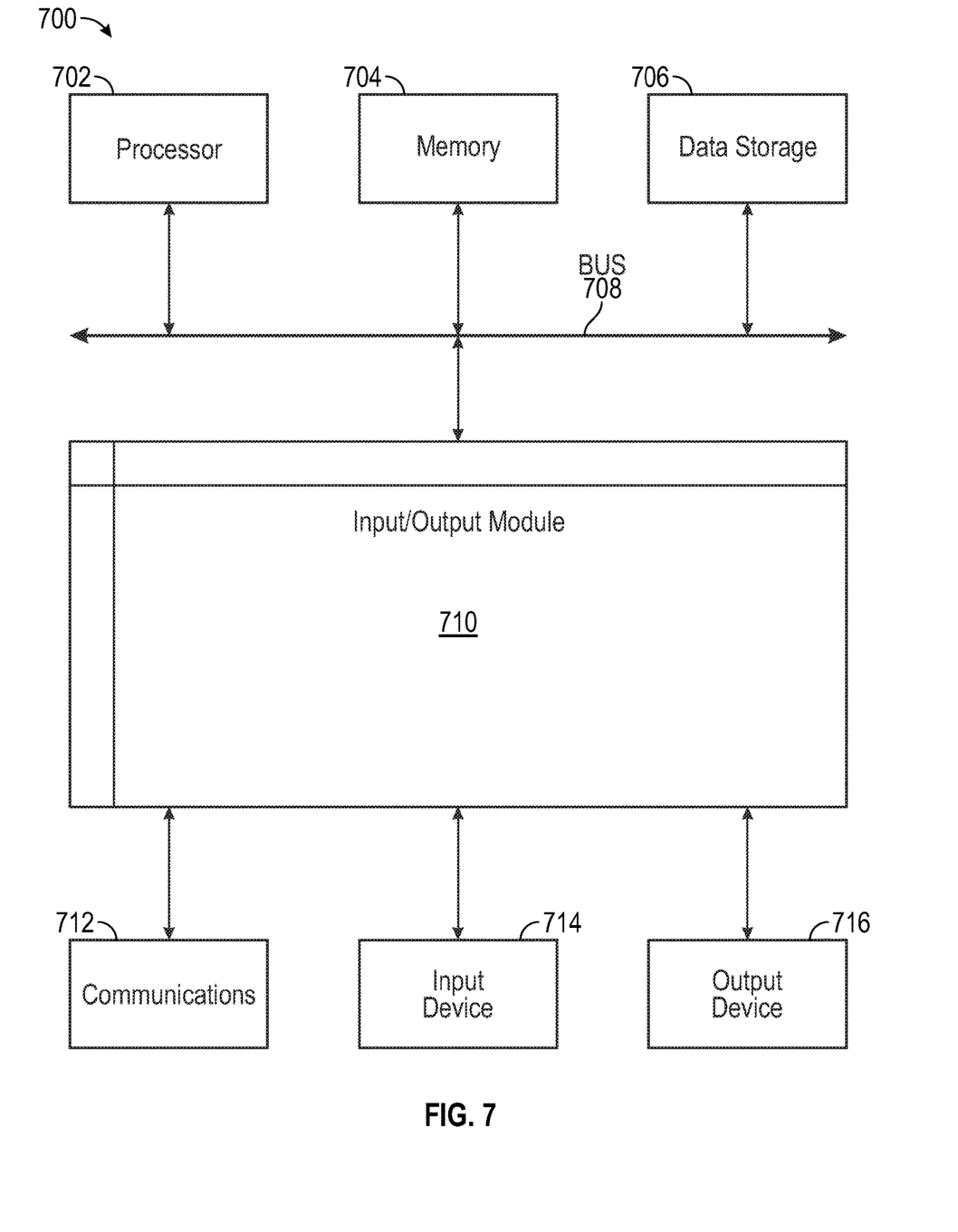
FIG. 7 is a block diagram illustrating an example computer system with which the circuits and systems in FIGS. 1-6 can be controlled to provide synchronized clock signals to multiple FPGAs, according to some embodiments.

FIG. 7 is a block diagram illustrating an example computer system 700 for controlling an operation of circuits and systems illustrated in FIGS. 1-6, according to some embodiments. For example, the computer system 700 may control one or more of the processors 136, 146, 236, 246, 436, and/or 446 in FIGS. 1, 2, and 4. More specifically, computer system 700 may include multiple circuits to perform an emulation of multiple netlists in an integrated circuit design, as disclosed herein. In certain aspects, computer system 700 can be implemented using hardware or a combination of software and hardware, either in a dedicated server, integrated into another entity, or distributed across multiple entities.

Computer system 700 includes a bus 708 or other communication mechanism for communicating information, and a processor 702 coupled with bus 708 for processing information. By way of example, computer system 700 can be implemented with one or more processors 702. Processor 702 can be a general-purpose microprocessor, a microcontroller, a Digital Signal Processor (DSP), an Application Specific Integrated Circuit (ASIC), a Field-Programmable Gate Array (FPGA), a Programmable Logic Device (PLD), a controller, a state machine, gated logic, discrete hardware components, or any other suitable entity that can perform calculations or other manipulations of information. In some embodiments, processor 702 may include modules and circuits configured as a 'placing' tool or engine, or a 'routing' tool or engine, to place devices and route channels in a circuit layout, respectively and as disclosed herein.

Computer system 700 includes, in addition to hardware, code that creates an execution environment for the computer program in question, e.g., code that constitutes processor firmware, a protocol stack, a database management system, an operating system, or a combination of one or more of them stored in an included memory 704, such as a Random Access Memory (RAM), a flash memory, a Read-Only Memory (ROM), a Programmable Read-Only Memory (PROM), an Erasable PROM (EPROM), registers, a hard disk, a removable disk, a CD-ROM, a DVD, or any other suitable storage device, coupled to bus 708 for storing information and instructions to be executed by processor 702. Processor 702 and memory 704 can be supplemented by, or incorporated in, special purpose logic circuitry.

The instructions may be stored in memory 704 and implemented in one or more computer program products, e.g., one or more modules of computer program instructions encoded on a computer-readable medium for execution by, or to control the operation of, the computer system 700, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NETLIST), and application languages (e.g., PUP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 704 may also be used for storing temporary variable or other intermediate information during execution of instructions to be executed by processor 702.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 700 further includes a data storage device 706 such as a magnetic disk or optical disk, coupled to bus 708 for storing information and instructions.

Computer system 700 is coupled via input/output module 710 to various devices. The input/output module 710 is any input/output module. Example input/output modules 710 include data ports such as USB ports. The input/output module 710 is configured to connect to a communications module 712. Example communications modules 712 include networking interface cards, such as Ethernet cards and modems. In certain aspects, the input/output module 710 is configured to connect to a plurality of devices, such as an input device 714 and/or an output device 716. Example input devices 714 include a keyboard and a pointing device, e.g., a mouse or a trackball, by which a user can provide input to the computer system 700. Other kinds of input devices 714 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 716 include display devices, such as an LED (light emitting diode), CRT (cathode ray tube), or LCD (liquid crystal display) screen, for displaying information to the user.

Circuits and systems in FIGS. 1-6 for providing synchronized clock signals to multiple FPGAs may be controlled by computer system 700 in response to processor 702 executing one or more sequences of one or more instructions contained in memory 704. Such instructions may be read into memory 704 from another machine-readable medium, such as data storage device 706. Execution of the sequences of instructions contained in main memory 704 causes processor 702 to control the circuits and systems in FIGS. 1-6 for providing synchronized clock signals to multiple FPGAs. One or more processors in a multi-processing arrangement may also be employed to execute the sequences of instructions contained in memory 704. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., Ethernet switch 250, and the like. For example, some aspects of the subject matter described in this specification may be performed on a cloud-computing environment. Accordingly, in certain aspects, a user of systems and circuits as disclosed herein may perform at least some of the steps by accessing a cloud server through a network connection. Further, data files, circuit diagrams, performance specifications, and the like resulting from the disclosure may be stored in a database server in the cloud-computing environment, or may be downloaded to a private storage device from the cloud-computing environment.

Computing system 700 includes servers and personal computer devices. A personal computing device and server are generally remote from each other and typically interact through a communication network. The relationship of client and server arises by virtue of computer programs running on the respective computers and having a client-server relationship to each other. Computer system 700 can be, for example, and without limitation, a desktop computer, laptop computer, or tablet computer. Computer system 700 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer-readable medium" as used herein refers to any medium or media that participates in providing instructions or data to processor 702 for execution. Such a medium may take many forms, including, but not limited to, non-volatile media, volatile media, and transmission media. Non-volatile media include, for example, optical disks, magnetic disks, or flash memory, such as data storage device 706. Volatile media include dynamic memory, such as memory 704. Transmission media include coaxial cables, copper wire, and fiber optics, including the wires that comprise bus 708. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more.

Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A system, comprising:
a first device, comprising:
a first non-blocking cross-point switch receiving a first plurality of clock inputs and outputting a first plurality of clock outputs;
a first plurality of buffering devices corresponding to the first plurality of clock outputs, the first plurality of buffering devices configured to synchronize the first plurality of clock outputs from the first non-blocking cross-point switch with each other, and output a first plurality of buffered clock signals; and
a plurality of programmable logic devices each receiving a corresponding buffered clock signal of the first plurality of buffered clock signals and an operation of the plurality of programmable logic devices is synchronized based on the received first plurality of buffered clock signals.

2. The system of claim 1, comprising:
a second device, comprising:
a second non-blocking cross-point switch receiving a second plurality of clock inputs and outputting a second plurality of clock outputs; and
a second plurality of buffering devices corresponding to the second plurality of clock outputs, the second plurality of buffering devices outputting a second plurality of buffered clock signals, wherein
the second plurality of buffered clock signals are synchronized with the first plurality of clock outputs,
the second plurality of buffered clock signals are provided to the plurality of programmable logic devices, and
an operation of the plurality of programmable logic devices is synchronized based on the received second plurality of buffered clock signals.

3. The system of claim 2, wherein a number of first plurality of input clock signals is same as a number of second plurality of input clock signals.

4. The system of claim 2, wherein the first plurality of clock inputs form a first group of clock inputs and the second plurality of clock inputs form a second group of clock inputs, wherein corresponding clock inputs in the first and second groups are assigned a same clock frequency.

5. The system of claim 2, wherein the first non-blocking cross-point switch and the second non-blocking cross-point switch are 8×8 cross-point switches.

6. The system of claim 2, wherein the plurality of programmable logic devices include Field Programmable Gate Arrays (FPGAs).

7. The system of claim 4, wherein different clock inputs in the first and second groups are assigned different clock frequencies.

8. The system of claim 2, further comprising:
a third non-blocking cross-point switch receiving a third plurality of clock inputs and outputting a third plurality of clock outputs; and
a third plurality of buffering devices corresponding to the third plurality of clock outputs, each buffering device from the third plurality of buffering devices receiving a corresponding clock output from the third plurality of clock outputs, and the third plurality of buffering devices configured to synchronize the third plurality of clock outputs with each other and thereby output a third plurality of buffered clock signals.

9. The system of claim 8, further comprising:
a plurality of blades, each blade including the first device and the second device, wherein
   a first buffered clock signal of the third plurality of buffered clock signals is provided to a first connector, the first connector outputting a first blade signal based on the first buffered clock signal of the third plurality of buffered clock signals,
   the first blade signal is provided to the first non-blocking cross-point switch and the second non-blocking cross-point switch of a first blade of the plurality of blades as a first remote clock input and an operation of the first non-blocking cross-point switch and the second non-blocking cross-point switch of the first blade is synchronized based on the first remote clock input,
   a second buffered clock signal of the third plurality of buffered clock signals is provided to a second connector, the second connector outputting a second blade signal based on the second buffered clock signal, and
   the second blade signal is provided to the first non-blocking cross-point switch and the second non-blocking cross-point switch of a second blade of the plurality of blades as a second remote clock input and an operation of the first non-blocking cross-point switch and the second non-blocking cross-point switch of the second blade is synchronized based on the second remote clock input.

10. The system of claim 9, further comprising:
a fourth non-blocking cross-point switch receiving a fourth plurality of clock inputs and outputting a fourth plurality of clock outputs; and
a fourth plurality of buffering devices receiving the fourth plurality of clock outputs, each buffering device of the fourth plurality of buffering devices receiving a corresponding clock output from the fourth plurality of clock outputs, and the fourth plurality of buffering devices configured to synchronize the fourth plurality of clock outputs with the third plurality of clock outputs and output a fourth plurality of buffered clock signals, wherein
   a first buffered clock signal of the fourth plurality of buffered clock signals is provided to the first connector, the first connector outputting the first blade signal based on the first buffered clock signal of the third plurality of buffered clock signals and the first buffered clock signal of the fourth plurality of buffered clock signals, and
   a second buffered clock signal of the fourth plurality of buffered clock signals is provided to the second connector, the second connector outputting the second blade signal based on the second buffered clock signal the third plurality of buffered clock signals and the second buffered clock signal of the fourth plurality of buffered clock signals.

11. The system of claim 10, wherein the third non-blocking cross-point switch and the fourth non-blocking cross-point switch are 8×8 cross-point switches.

12. The system of claim 9, further comprising:
a fourth non-blocking cross-point switch receiving a fourth plurality of clock inputs and outputting a fourth plurality of clock outputs, wherein
   the fourth plurality of clock outputs including a first group of clock outputs and a second group of clock outputs,
   the first group of clock outputs are provided to buffering devices of the third plurality of buffering devices, the third plurality of buffering devices are configured to output a fifth plurality of buffered clock signals,
   the second group of clock outputs are provided to buffering devices of a fourth plurality of buffering devices, the plurality of buffering devices are configured to output a sixth plurality of buffered clock signals,
   a buffered clock signal of the fifth plurality of buffered clock signals is provided to a first connector, the first connector outputting the first blade signal based on the buffered clock signal of the fifth plurality of buffered clock signals, and
   a buffered clock signal of the sixth plurality of buffered clock signals is provided to a third connector, the third connector outputting the second blade signal based on the buffered clock signal of the sixth plurality of buffered clock signals.

13. The system of claim 12, wherein the fifth plurality of buffered clock signals and the sixth plurality of buffered clock signals are synchronized with each other.

14. The system of claim 12, wherein the third plurality of buffering devices are configured to output the third plurality of buffered clock signals or the fifth plurality of buffered clock signals based on a control signal provided to the third plurality of buffering devices.

15. The system of claim 12, wherein the fourth non-blocking cross-point switch is a 40×40 cross-point switch.

16. A system, comprising:
a first non-blocking cross-point switch receiving a first plurality of clock inputs and outputting a first plurality of clock outputs;
a first plurality of buffering devices receiving the first plurality of clock outputs and outputting a first plurality of buffered clock signals, the first plurality of buffered clock signals being synchronized with each other;
a first plurality of connectors receiving the first plurality of buffered clock signals and outputting a plurality of blade signals; and
a plurality of blades receiving the plurality of blade signals, each blade including a plurality of programmable logic devices, an operation of each programmable logic device being synchronized based on the first plurality of clock inputs.

17. The system of claim 16, wherein each blade comprises:
a second non-blocking cross-point switch configured to receive a blade signal of the plurality of blade signals, wherein
   the second non-blocking cross-point switch outputs a second plurality of clock outputs based on the received blade signal, and
   the second plurality of clock outputs are provided to the plurality of programmable logic devices.

18. The system of claim 16, further comprising:
a second non-blocking cross-point switch receiving a second plurality of clock inputs and outputting a second plurality of clock outputs; and
a second plurality of buffering devices receiving the second plurality of clock outputs and outputting a second plurality of buffered clock signals, the second plurality of buffered clock signals being synchronized with each other, wherein
the second plurality of buffered clock signals are provided to the first plurality of connectors, the first plurality of connectors outputting the plurality of blade signals based on the first plurality of buffered clock signals and the second plurality of buffered clock signals, and
an operation of each programmable logic device being synchronized based on one of the first plurality of clock inputs and the second plurality of clock inputs.

19. A system, comprising:
a first non-blocking cross-point switch receiving a first plurality of clock inputs and outputting a first plurality of clock outputs, the first plurality of clock outputs including a first set of clock outputs and a second set of clock outputs;
a first set of buffering devices receiving the first set of clock outputs and outputting a first set of buffered clock signals;
a second set of buffering devices receiving the second set of clock outputs and outputting a second set of buffered clock signals, the first set of buffered clock signals and the second set of buffered clock signals being synchronized with each other;
a second non-blocking cross-point switch receiving a second plurality of clock inputs and outputting a second plurality of clock outputs, wherein
the second plurality of clock outputs are provided to the first set of buffering devices,
the first set of buffering devices outputting a first set of buffered clock signals based on one of the first set of clock outputs and the second plurality of clock outputs, and
the second set of buffering devices outputting a second set of buffered clock signals based on the second set of clock outputs;
a first set of connectors receiving the first set of buffered clock signals and outputting a first plurality of blade signals based on the first set of buffered clock signals;
a second set of connectors receiving the second set of buffered clock signals and outputting a second plurality of blade signals based on the second set of buffered clock signals; and
a plurality of blades receiving the first plurality of blade signals and the second plurality of blade signals, wherein
each blade includes a plurality of programmable logic devices, and
an operation of each programmable logic device is synchronized based on one of the first plurality of clock inputs and the second plurality of clock inputs.

20. The system of claim 19, further comprising:
a third non-blocking cross-point switch receiving a third plurality of clock inputs and outputting a third plurality of clock outputs, the third plurality of clock outputs including a third set of clock outputs and a fourth set of clock outputs;
a third set of buffering devices receiving the third set of clock outputs and outputting a third set of buffered clock signals; and
a fourth set of buffering devices receiving the fourth set of clock outputs and outputting a fourth set of buffered clock signals, the first set of buffered clock signals, the second set of buffered clock signals, the third set of buffered clock signals and the fourth set of buffered clock signals being synchronized with each other, wherein
the third set of buffered clock signals provided to the first set of connectors, the first set of connectors outputting the first plurality of blade signals based on the first set of buffered clock signals and the third set of buffered clock signals, and
the fourth set of buffered clock signals provided to the second set of connectors, first set of connectors outputting the first plurality of blade signals based on the second set of buffered clock signals and the fourth set of buffered clock signals.

* * * * *